United States Patent
Liu et al.

(10) Patent No.: US 10,879,929 B2
(45) Date of Patent: Dec. 29, 2020

(54) LDPC DECODING METHOD

(71) Applicant: Amlogic (Shanghai) Co., Ltd., Shanghai (CN)

(72) Inventors: Xiaotong Liu, Shanghai (CN); Xiao Zhang, Shanghai (CN)

(73) Assignee: AMLOGIC (SHANGHAI) CO., LTD, Shanghai (CN)

( * ) Notice: Subject to any disclaimer, the term of this patent is extended or adjusted under 35 U.S.C. 154(b) by 58 days.

(21) Appl. No.: 15/567,006

(22) PCT Filed: Apr. 19, 2017

(86) PCT No.: PCT/CN2017/081025
§ 371 (c)(1),
(2) Date: Oct. 16, 2017

(87) PCT Pub. No.: WO2018/036178
PCT Pub. Date: Mar. 1, 2018

(65) Prior Publication Data
US 2018/0287637 A1 Oct. 4, 2018

(30) Foreign Application Priority Data
Aug. 26, 2016 (CN) .......................... 2016 1 0739659

(51) Int. Cl.
*H03M 13/11* (2006.01)
*H03M 13/00* (2006.01)
*H03M 7/00* (2006.01)

(52) U.S. Cl.
CPC ......... *H03M 13/1131* (2013.01); *H03M 7/00* (2013.01); *H03M 13/112* (2013.01); *H03M 13/114* (2013.01); *H03M 13/116* (2013.01); *H03M 13/1122* (2013.01); *H03M 13/1128* (2013.01); *H03M 13/1137* (2013.01); *H03M 13/1185* (2013.01); *H03M 13/1188* (2013.01);
(Continued)

(58) Field of Classification Search
CPC .................................................. H03M 13/1131
See application file for complete search history.

(56) References Cited

U.S. PATENT DOCUMENTS

| 7,934,147 B2 * | 4/2011 | Lakkis | H03M 13/1117 714/800 |
| 2008/0246639 A1 * | 10/2008 | Sakai | H03M 13/1117 341/107 |
| 2014/0201593 A1 * | 7/2014 | Ling | G06F 11/1012 714/758 |

FOREIGN PATENT DOCUMENTS

| CN | 101267209 | 9/2008 |
| CN | 101345532 | 1/2009 |
| CN | 102412846 | 4/2012 |

* cited by examiner

*Primary Examiner* — Steve N Nguyen
(74) *Attorney, Agent, or Firm* — Umberg Zipser LLP

(57) ABSTRACT

The invention relates to the field of decoders, more specifically, to a decoding method of LDPC (Low Density Parity Check Code). The decoding method comprising: in the rwsr (Row-Wise Scanning Round) phase, the recovery circuit reads a plurality of sign bits, the absolute value of a minimum value, the absolute value of a second smallest value and the absolute value of a third smallest value which are stored previously, and they are output by a comparison and a selector, the output of the comparator and selector is shifted, and then is combined with each sign bit to obtain an update message of the previous check node, the update message is subtracted from the posterior probability by the addition circuit to obtain an input of the update unit.

3 Claims, 15 Drawing Sheets

(52) U.S. Cl.
CPC ..... *H03M 13/658* (2013.01); *H03M 13/6588* (2013.01)

Figure 1c
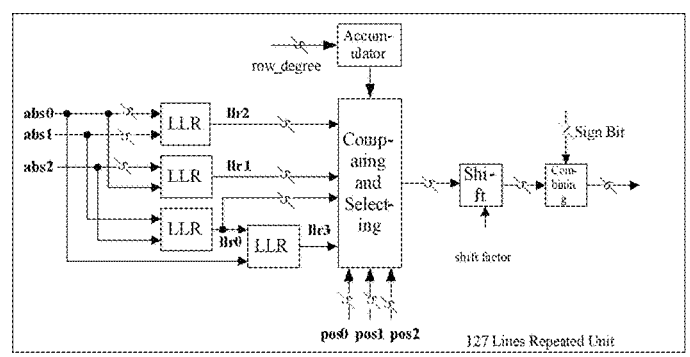
Figure 2
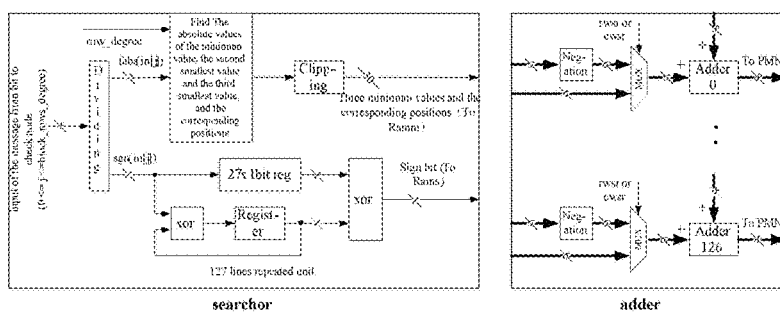
Figure 3

LDPC DECODING METHOD

CROSS-REFERENCE TO RELATED APPLICATIONS

The present application claims priority to and the benefit of Chinese Patent Application No. CN 201610739659.8, filed on Aug. 29, 2016, the entire content of which is incorporated herein by reference.

BACKGROUND OF THE INVENTION

1. Field of the Invention

The invention relates to the field of decoder, more especially, an LDPC decoder method.

2. Description of the Related Art

LDPC (Low Density Parity Check Code) is a class of linear block codes whose decoding has the characteristic of parallel decoding structure and fast processing. With the rapid development of VLSI technology, more and more communication systems use LDPC codes as their decoding scheme. The theoretical basis of the LDPC code is a bipartite graph (also called the Tanner graph). The message passing algorithm based on the soft decision is equivalent to the optimal maximum likelihood decoding in the case where the code length is infinite and the bipartite graph is acyclic.

The LDPC decoder structure comprises: flood-type update, horizontal update and vertical update. The flood-type structure is that when the iteration is updated, both the variable node and the check node of the flood structure adopt the values that were last updated; and the horizontal structure (also known as turbo structure, hierarchical structure) is that when the iteration is updated and after the check node is updated, variable node adopts the input value after the check node is updated. The vertical structure is that when the iteration is updated and after the variable node is updated, the check node adopts the input value after the variable node is updated. LDPC has three process modes, which are parallel, serial and mixed. As each row of the check matrix and each column of the check matrix is not necessarily linked, so that the check node and variable node can be updated at the same time, that is, they can be parallel processing, to achieve the maximum decoding speed. However, the hardware resources consumption is also biggest. Corresponding to the parallel processing, another processing method is serial processing, that is, the update of each row and column is in a serial manner, it is the slowest. However, the hardware resources consumption is minimal. Mixed processing is a compromised processing during the hardware design, so as to meet the requirements of the actual system. A part of them can be processed at the same time, so that the processing speed and hardware resources can strike an average, the parallel processing Factor P can be adjusted to meet the requirements of the actual system.

The three structures of flood-type, horizontal and vertical are different in their implementation, and the intermediate variables that need to be stored are different in each iteration update. The storage capacity of the flood-type structure is about twice as that of the horizontal structure and the vertical structure, and the update rate of the flood-type structure is slower. However, it is suitable for any form of check matrix. With respect to the horizontal structure and the vertical structure, as the variable node (or check node) immediately adopts the updated input after the check node (or variable node) is updated, there is no need to store the intermediate variable, and the corresponding memory is halved. Due to the adoption of updated input, the convergence rate is speeded up, so that the convergence rate can be about doubled when achieving the same BER (bit error rate). On the other hand, it is necessary to carefully design the corresponding check matrix to ensure that the update can be implemented more conveniently during a hardware design. For example, QC-LDPC (quasi-cyclic-LDPC), which has a certain structure, is particularly convenient when adopting it. However, there are limitations in the prior art, for example, the prior art algorithms are complicated to implement with the big storage, and the known simplified algorithms have loss of performance. In addition, the present LLR operations require a memory with large storage capacity during the coding logic process.

SUMMARY OF THE INVENTION

For the deficiencies of the prior art, the present invention provides an LDPC decoding method capable of reducing storage capacity and number of iterations.

The invention utilizes the following technical scheme.

An LDPC decoding method, comprising:

In the rwsr (Row-Wise Scanning Round) phase, the recovery circuit reads each sign bit, the absolute value of a minimum value, the absolute value of a second smallest value and the absolute value of a third smallest value which are stored previously, then the recovery circuit restores each output of the previous check node update unit, specifically:

shift the output of the comparator and selector, combine the shifted output with the sign bit to obtain an update message of the previous check node, subtract the update message from the posterior probability by the addition circuit to obtain an updated input of the update unit;

in the cwsr (Column-Wise Scanning Round) phase, from each update information output by the recovery circuit, search the absolute value of the minimum value, the absolute value of the second smallest value and the absolute value of the third smallest value and the corresponding position through the search module, each sign bit is stored in the corresponding RAM (random access memory), and the value of the posterior probability is updated. The decoding method further comprising: in the rwsr phase, a rearranged network takes out the values in the posterior probability, and maps the value to the input of the update unit according to the offset address in each matrix, to implement permute;

in the cwsr phase, the rearranged network updates the output of the update unit back to the posterior probability according to the offset address, to implement an anti-permute.

In the cwsr phase, the check equation calculation unit verifies whether the currently translated codeword is valid.

The recovery circuit, the search module and the adding circuit adopt a multi-way parallel operation mode.

The decoding formula in the decoding method is:

$$Lr_{c>v}^{k} = \prod_{n \in N(c) \setminus v} \operatorname{sgn}(Lq_{n>c}^{k-1}) \times \Phi\left( \sum_{n \in N_3(c) \setminus v} \Phi(|Lq_{n>c}^{k-1}|) \right) \times \alpha;$$

Wherein, $Lr_{c>v}^{k}$ is the external log likelihood ratio information which is transmitted from the check node c to the variable node v in the $k^{th}$ iteration; $Lq_{n>c}^{k-1}$ is the external log likelihood ratio information which is transmitted from the variable node n to the check node c in the $(k-1)^{th}$ iteration; N(c)\v is variable node set that is connected to the check node c except for the variable node v. $N_3$(c)\v is three minimum values of the N(c)\v set; sgn( ) is operation which is used to obtain the sign bit; $\alpha$ is the normalization factor which it is used to reduce the value of the three minimum values in calculation; $\Phi(x)$ is a monotonically decreasing function.

Wherein, the function $\Phi(x)$ is implemented by LLR operation.

The formula for the LLR is:

$$LLR(|a|, |b|) = \min(|a|, |b|) + \left(\log\left(1 + e^{-\frac{|a+b|}{c}}\right) - \log\left(1 + e^{-\frac{|a-b|}{c}}\right)\right) \times c$$

Wherein, c is the quantization factor; the absolute values of a and b are the values in the predefined range.

In the decoding method, an absolute value of the minimum value and its corresponding position are stored in each update of the check node, an absolute value of the second smallest value and its corresponding position are stored in each update of the check node, and an absolute value of the third smallest value and its corresponding position are stored in each update of the check node.

In the decoding method, each sign bit of the variable node corresponding to the check node is stored.

In the decoding method, two messages storing the posterior probability are used to perform the Ping-Pong action.

The beneficial implements of the present invention are:

The storage capacity of the invention can be about half of that of the sum-product algorithm, and when the same BER performance is achieved, the number of iterations can be about half of the sum-product algorithm so as to reach a tradeoff in area and processing speed. According to the structural characteristics of the DTMB LDPC code, a simplified decoding method and a calculation method of the LLR operation are proposed in consideration of both performance and hardware implementation, its performance is equivalent to the original algorithm, and the storage capacity in which the algorithm consumes is less than that of the original algorithm.

BRIEF DESCRIPTIONS OF THE DRAWINGS

The accompanying drawings, together with the specification, illustrate exemplary embodiments of the present disclosure, and, together with the description, serve to explain the principles of the present invention.

FIGS. 1a-1c are non-regular quasi-cyclic check matrices constructed by the DTMB of the present invention;

FIG. 2 is a schematic diagram of the recovery circuit of the present invention;

FIG. 3 is a schematic diagram of the search module of the present invention;

DETAILED DESCRIPTION

Figure 4:
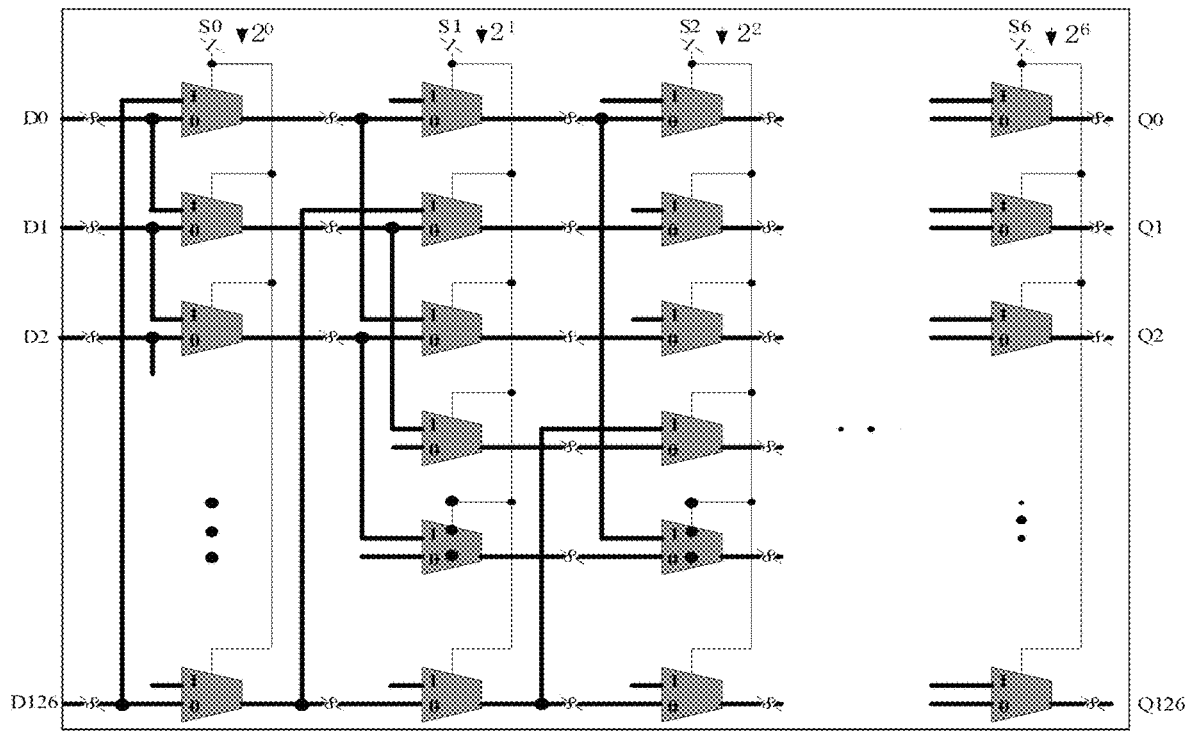
FIG. 4 is a structural diagram of the permute network of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

At present, there are many constructions of LDPC codes that are used. There are two kinds of code sets which are used mostly: check matrix of pseudo-random construction and check matrix of quasi-cyclic construction. Although check matrix of pseudo-random construction has good performance, it is not prone to be implemented. The performance of check matrix of quasi-cyclic construction is no less than that of check matrix of pseudo-random construction, and its coding complexity is in proportion to the code length, the decoding is also simple, and thus it has been used a lot in the actual system. For example, it has been used in the new generation dvb (dvb-c2, dvb-s2, dvb-t2), cmmb, Ieee 802.11, Ieee 802.16 and dtmb standard.

There are two types of decoding of LDPC codes in the present invention: hard decision decoding and soft decision decoding. Soft decision decoding usually has a higher coding gain than hard decision decoding, wherein the soft decision decoding algorithm, that is, the original algorithm (sum-product algorithm) includes the steps of:

Step 1: Initialize the internal likelihood ratio of the channel $$Lq_{v \to c}^0 = Li_v$$

Step 2: Check node updates (horizontal update)

$$Lr_{c \to v}^k = \prod_{n \in N(c) \backslash v} \text{sgn}(Lq_{n \to c}^{k-1}) \times \Phi\left( \sum_{n \in N(c) \backslash v} \Phi(|Lq_{n \to c}^{k-1}|) \right)$$

Wherein, $$\Phi(x) = \Phi^{-1}(x) = \log\left( \frac{e^x + 1}{e^x - 1} \right)$$

Step 3: Variable node update (vertical update)

$$Lq_{v \to c}^k = Li_v + \sum_{m \in M(v) \backslash c} Lr_{m \to v}^{k-1}$$

$$Lq_{v \to c}^k = LQ^{k-1} - Lr_{c \to v}^{k-1}$$

Step 4: Hard decision $$LQ_v^k = Li_v + \sum_{m \in M(v)} Lr_{m \to v}^{k-1}, \hat{c}_v = \begin{cases} 1 & \text{if } LQ_v^k \geq 0 \\ 0 & \text{if } LQ_v^k < 0 \end{cases}$$

Step 5: Terminate iteration

The iteration terminates when $Hc^T=0$ is satisfied, or when the predefined maximum number of iterations $N_{iter}$ is reached, otherwise it is returned to the step 2 to continue to iterate.

The present embodiment proposes a simplified method of decoding and a LLR operation in the decoding process. The original algorithm involves a complex function $\Phi(x)$ when the check node is updated, $\Phi(x)$ is a monotonically decreasing function whose value is determined by the smaller input. Some of the following symbol sets are commonly used in LDPC decoding, which means:

Let $Lr_{c \to v}^k$ denote the external log likelihood ratio information which is transmitted from the check node c to the variable node v in the $k^{th}$ iteration.

Let $Lq_{v \to c}^k$ denote the external log likelihood ratio information which is transmitted from the variable node v to the check node c in the $k^{th}$ iteration.

Let $Li_v$ denote the the variable node v receives the internal likelihood ratio from the channel.

N(c) represents variable node set that is associated with the check node c

N(c)\v represents variable node set that is associated with the check node c except for the variable node v M(v) represents check node set that is associated with the variable node v.

M(v)\c represents check node set that is associated with the variable node v except for the check node c In the present embodiment, in order to simplify the processing, only three minimum values are used, and the present embodiment is based on these three minimum values. Based on this idea, the following equation is obtained:

$$Lr_{c>v}^k = \prod_{n \in N(c) \backslash v} \text{sgn}(Lq_{n>c}^{k-1}) \times \Phi\left( \sum_{n \in N_3(c) \backslash v} \Phi(|Lq_{n>c}^{k-1}|) \right) \times \alpha$$

Wherein, $N_3(c)$ is the three minimum values in the N(c) set; sgn( ) is operation which is used to obtain the sign bit; $\alpha$ is the normalization factor which it is used to reduce the value of the three minimum values in calculation. We can simplify the operation by the shifting, specifically, it is a configurable register. $\Phi(x)$ $\Phi(x)$ is implemented by adopting LLR operation.

Wherein, LLR is defined as:

$$LLR(|a|, |b|) = \min(|a|, |b|) + \left( \log\left(1 + e^{-\frac{|a+b|}{c}}\right) - \log\left(1 + e^{-\frac{|a-b|}{c}}\right) \right) \times c$$

In the above formula, the parameter c is the quantization factor. In the present embodiment, the check node update unit information is 6 bits, wherein 1 bit is sign bit, 3 bits are integers, and 2 bits are fractions, so that the value of c is 4. As this is a transcendental function, we need to use a lookup table to store it in advance, wherein the range of |a| and |b| is 0-31, so the size of the table is 32×32×6=6144 bit. In order to reduce the memory size, this embodiment proposes an equivalent operation method, which is calculated as follows. First define:

Z_small=min(|a|,|b|), which is the smaller value of |a| and |b|

Z_large=max(|a|,|b|), which is the larger value of |a| and |b|

Z_diff=z_large−z_small, which is the difference between these two values

And then make a judgement according to the following formula, to find z1 and z2 if (z_small==0&&(z_diff==0&& z_large>=2))

z1=3;

else if (z_small==0&&(z_large<=2))

z1=2;

else if (z_small==0&&(z_large>=3&& z_large<=6))

z1=1;

else if (z_small==1&&(z_large<=7&& z_large!=4))

z1=1;

else if (z_large<=3&& z_diff==1)

z1=1;

else if (z_large<=5&&(z_diff==2||z_diff==0))

z1=1;

else if (z_small<=2&&(z_diff==6))

z1=1;

else if ((z_small<=8&& z_small>=3) && z_diff==8)

z1=1;

else z1=0;

if ((z_diff==0&& z_large>=2))

z2=3;

else if ((z_diff==1&& z_large>=5))

z2=2;

else if (z_large<=10&& z_diff<=2||z_large>10&& z_diff<=3)

z2=2;

else if (z_large<=10&& z_diff<=6)

z2=1;

else if (z_large>10&& z_diff<=8)

z2=1;

else z2=0;

After obtaining z1 and z2, the following calculation is performed:

Z_adj=z1−z2;

LLR(|a|,|b|)=z_small+z_adj;

In the present embodiment, the decoding process mainly includes the following steps: in order to reduce the demand for memory, normalized 3 minimum values are adopted for data compression, and then the algorithm is combined with the turbo scheduling strategy to reduce the storage capacity and the complexity of the realization. First, the algorithm stores only six values in the each update of check node: the absolute values of the minimum value, the second smallest value and the third smallest value (each 5 bits) and the corresponding position thereof (each 5 bits); and then store each sign bit (equal to the total number of "1" in H). The posterior probability message is stored in two rains (8 bit, wherein the left two bits are shared by the two rams) for Ping-Pong work. The implementation is as follows. The use of the decoding device memory: Romb and Romo are configured to store the check matrix base address (H_base) and offset address (H_offset) respectively, which are [35×8+23×13+11×27]×6+[35×8+23×13+11×27]×7=11388 bit;

Rami is configured to store input priori message, which is 59×127×6=44958 bit;

Ramp is configured to store posterior probability messages, which is 59×127×8=59944 bits;

Ramm is configured to store the absolute value of the minimum value, the second smallest value and the third smallest value of the check node update message and the corresponding position thereof, which are 35×127×3×10=133350 bit;

Rams is configured to store the sign bit of the check node update message, which is 299×127×1=37973 bit.

The total memory size is: 11388+44958+59944+133350+37973=287613 bit;

The original algorithm memory size is: 11388+2×59×127×6+299×127×6=329142 bit. Compared to the original algorithm memory size, the saving size is 329142−287613=41529 bit;

With respect to H_base and H_offset in this embodiment: FIGS. 1a-1c are the irregular quasi-cyclic check matrices constructed by dtmb, which can be represented by two matrices, which are base address H_base and offset address H_offset. Each small square in the figure represents a small matrix of 127×127, where the numbers represent the offset addresses of the unit array and the absence of number represents "0" matrix. For example, in the 0.4 bit rate, the H_base which corresponds to row 0 is 32, 33, 34, 35, 43, 51, 53; H_offset corresponds to 67, 41, 21, 74, 3, 13, 117; the others are similar. With respect to the check matrix with a bit rate of 0.4, the row_degree is 7 and 8, the col_degree is 3, 4 and 11; with respect to the check matrix with a bit rate of 0.6, the row_degree is 12 and 13, the col_degree is 3, 4, 7 and 16; with respect to the check matrix with a bit rate of 0.8, the row_degree is 26 and 27, the col_degree is 3, 4, and 11. Since the LDPC codeword of DMB-TH is the systematic code, and the check bit is in the front, the information bit is in the post, it can be seen from col_degree of the check matrix that the col_degree of the latter information bit is large, so that it has a higher decoding reliability, namely the so-called unequal error protection feature.

The LDPC decoder in this embodiment has five blocks of logic operation unit: recovery circuit (recovery), search module (searchor), adding circuit (adder), permute network (PMN) and check equation calculation (PEC). Wherein the circuit structures of recover, searchor, adder and PMN are shown in FIGS. 2-4, which are divided into two phases, rwsr and cwsr. The processing time of each phase is row_degree and is also accumulated range of accumulator.

In the rwsr phase, recover reads the values previously stored in the rains (sign bits) and ramm (the absolute value of the minimum value, the second smallest value and the third smallest value), and recovers each output of the previous check node update unit (CNU) via the recover module. The selector outputs llr0 when the value of accumulator is the minimum value position (pos0); the selector outputs llr1 when the value of the accumulator is the second smallest value position (pos1); the selector outputs llr2 when the value of the accumulator is the third smallest value position (pos2); at other positions, the selector outputs llr3.

Wherein, llr0=LLR(abs1, abs2), llr1=LLR(abs0, abs2), llr2=LLR(abs0, abs1), llr3=LLR(LLR(abs0, abs1),abs2), the calculation of LLR operation has been shown in the above.

And then shift the output of the selector. The shift factor alpha=0.9375, is a configurable register, and then it is combined with the sign bit to get the update message of the previous check node bit. Then the ramp (posterior probability) subtracts the updated message through the adder module to get the input (message from the bit node to the check node) of the CNU unit update. Wherein the recover, searchor and add module are parallel processing with 127 cells simultaneously.

In the swsr phase, according to the input of the CNU unit update, the searchor module searches the absolute value of the three minimum values and the corresponding position and each sign bit to store in the corresponding ramm and rains, recovers each output of the CNU through the recover module, add it to the output value (temporary storaged by register) of the adder module in the rwsr phase, and then update the value of the ramp.

As shown in FIG. 4, PMN are divided into two phases; in the rwsr phase, the permute function is implemented, the value of the ramp (stored in column-wise mode) is fetched, and then according to offset address 127-H_offset of each matrix, map it to the input of each check node update unit (processed in row-wise mode). In the cwsr phase, the anti-permute function is implemented, the output of the CNU (processed in row-wise mode) is updated back to the ramp (stored in column-wise mode) according to the offset address H_offset in each matrix. As the check matrix of dtmb ldpc has the characteristics of quasi-cyclic shift, it is relatively simple to use a simple barrel shifter to implement it. We are dealing with 127 cells data at the same time, so 127×7=889 selectors of 8 bit is needed to achieve a 127×127 barrel shifter.

Figure 5:
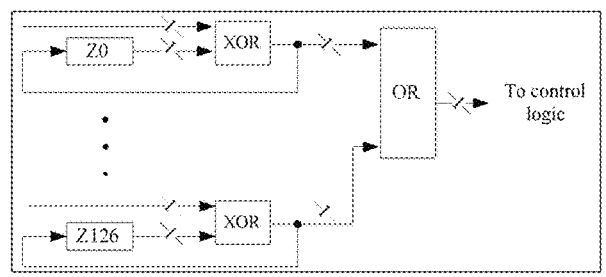
FIG. 5 is a schematic diagram of the check equation module of the present invention.

The circuit structure of check equation calculation (PEC) is shown in FIG. 5, it only works in the cwsr phase to verify whether the codeword which is currently decoded is valid or not. After a large iteration is accomplished, and all the check equations are satisfied, it indicates that the codeword is currently correct and that no more iteration is performed (in actual operation, in order to prevent the posterior probability information of each small iteration update from being not very accurate, we determine all the check equations are satisfied after two large iterations are accomplished). Otherwise, the iteration is keep going until the maximum number of iterations is reached. The circuit consists of XOR cells and OR cells, which are implemented simultaneously by 127 parallel cells.

Figure 6:
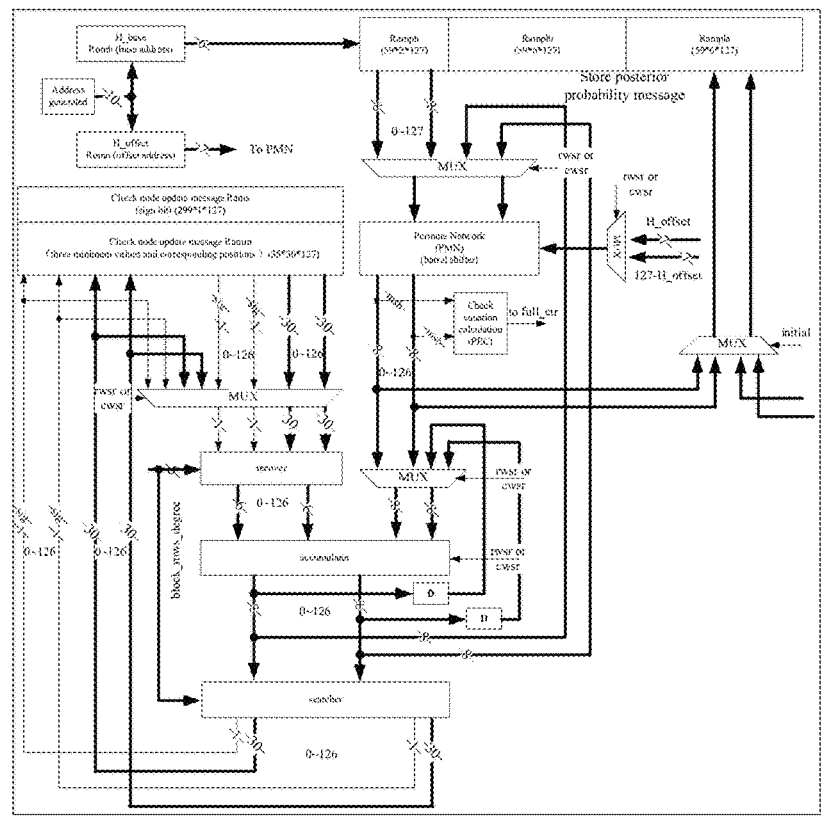
FIG. 6 is a connection diagram of the DTMB LDPC device of the present invention.

We also need a control logic in the design, so as to give the control signals required by each module, and read/write enable of memory, they are divided into small iteration (each row block) control logic and Top control, comprising read enable and read address of Romb and Romo; read address and write address and read enable and write enable of Ramp and Ramm and Ramms, control signals in rwsr and cwsr phases, control signals required by large iteration loop. FIG. 6 shows the top structure of the decoder.

Figure 7:
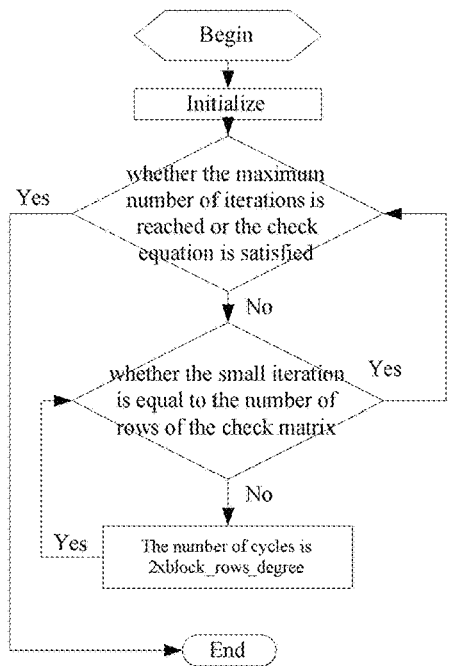
FIG. 7 is a flow chart of the implementation of the LDPC of the present invention.
Figure 8A:
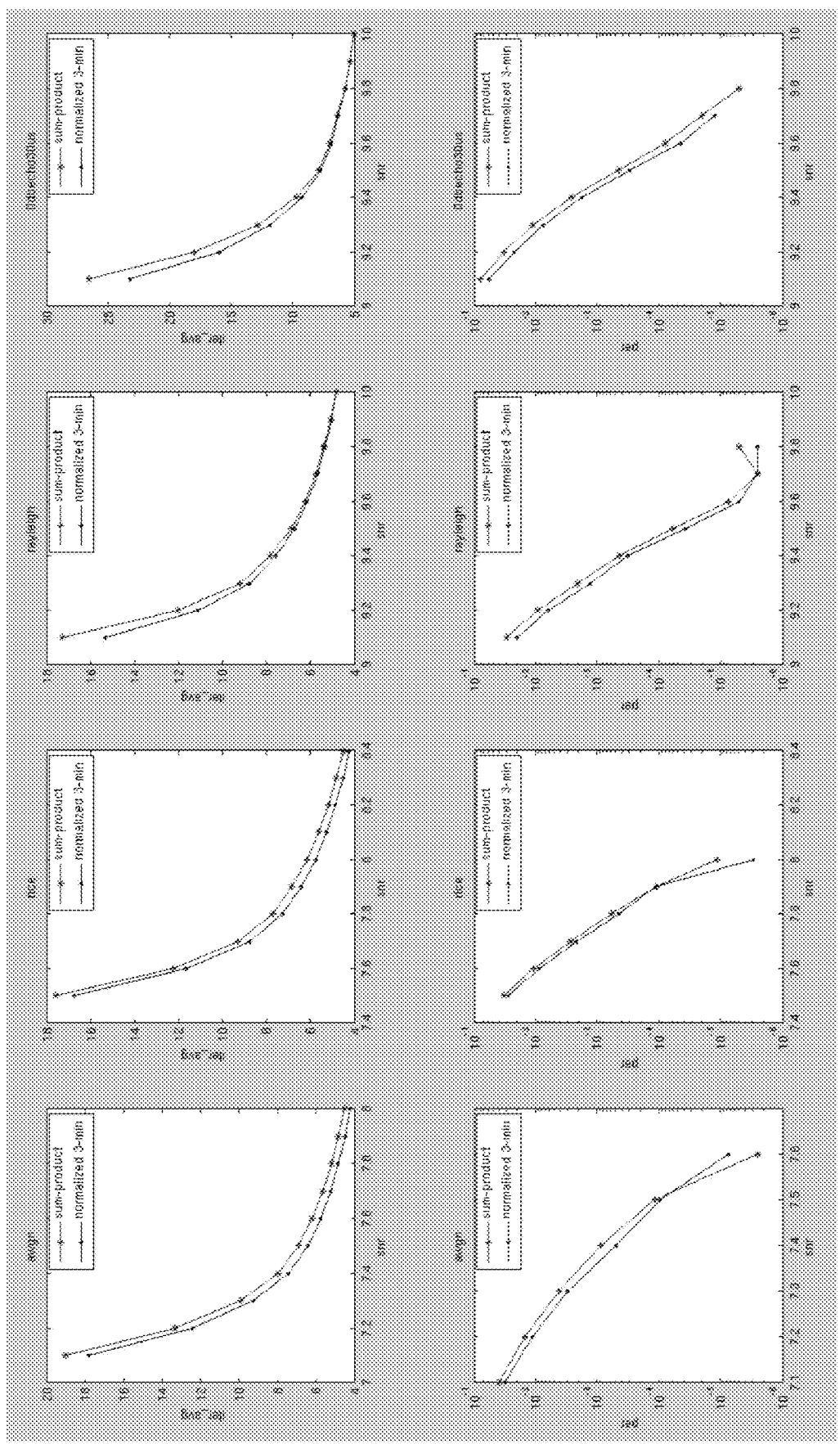
FIGS. 8a-8j are diagrams of simulation results of the present invention.
Figure 8B:
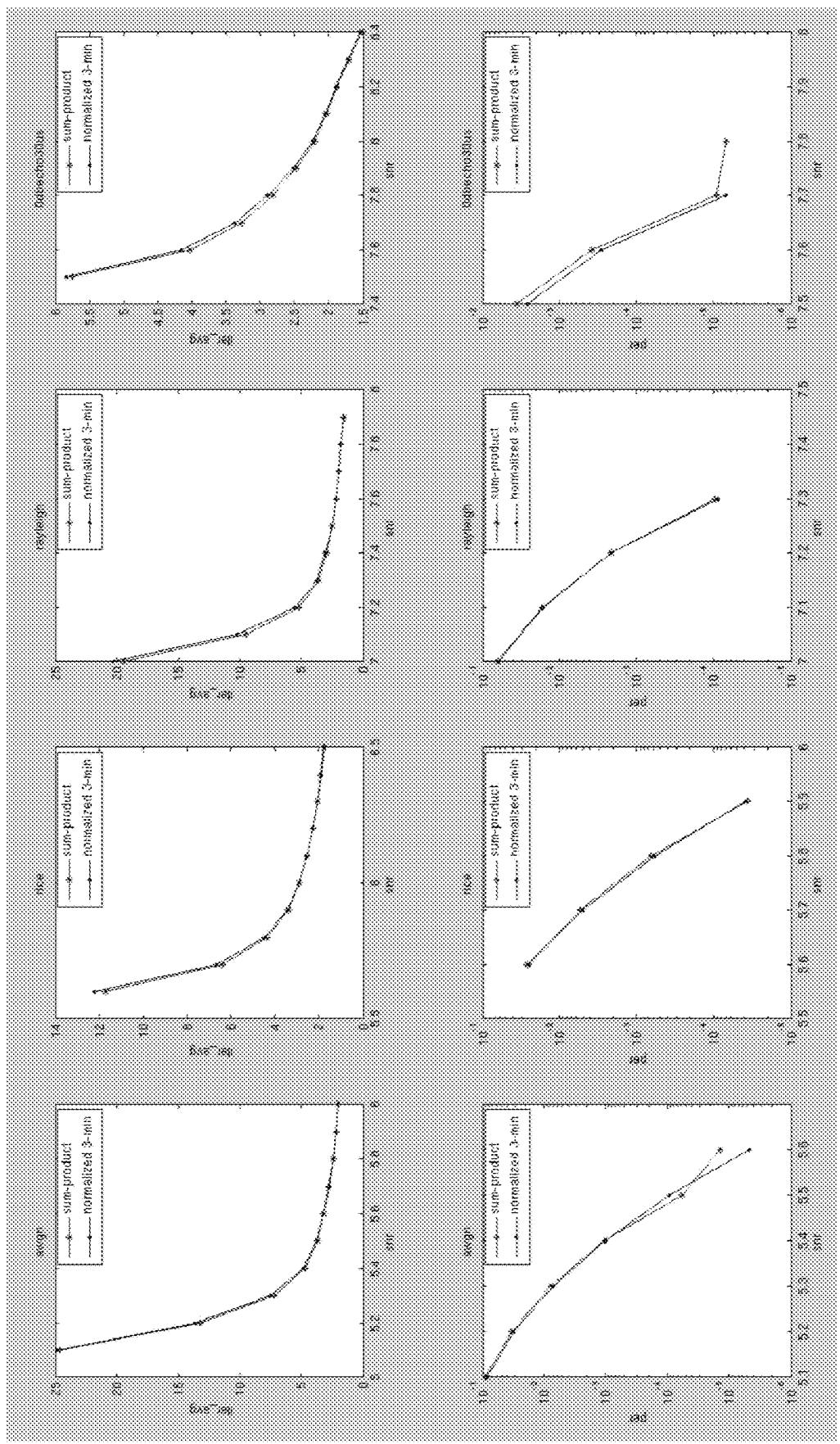
Figure 8C:
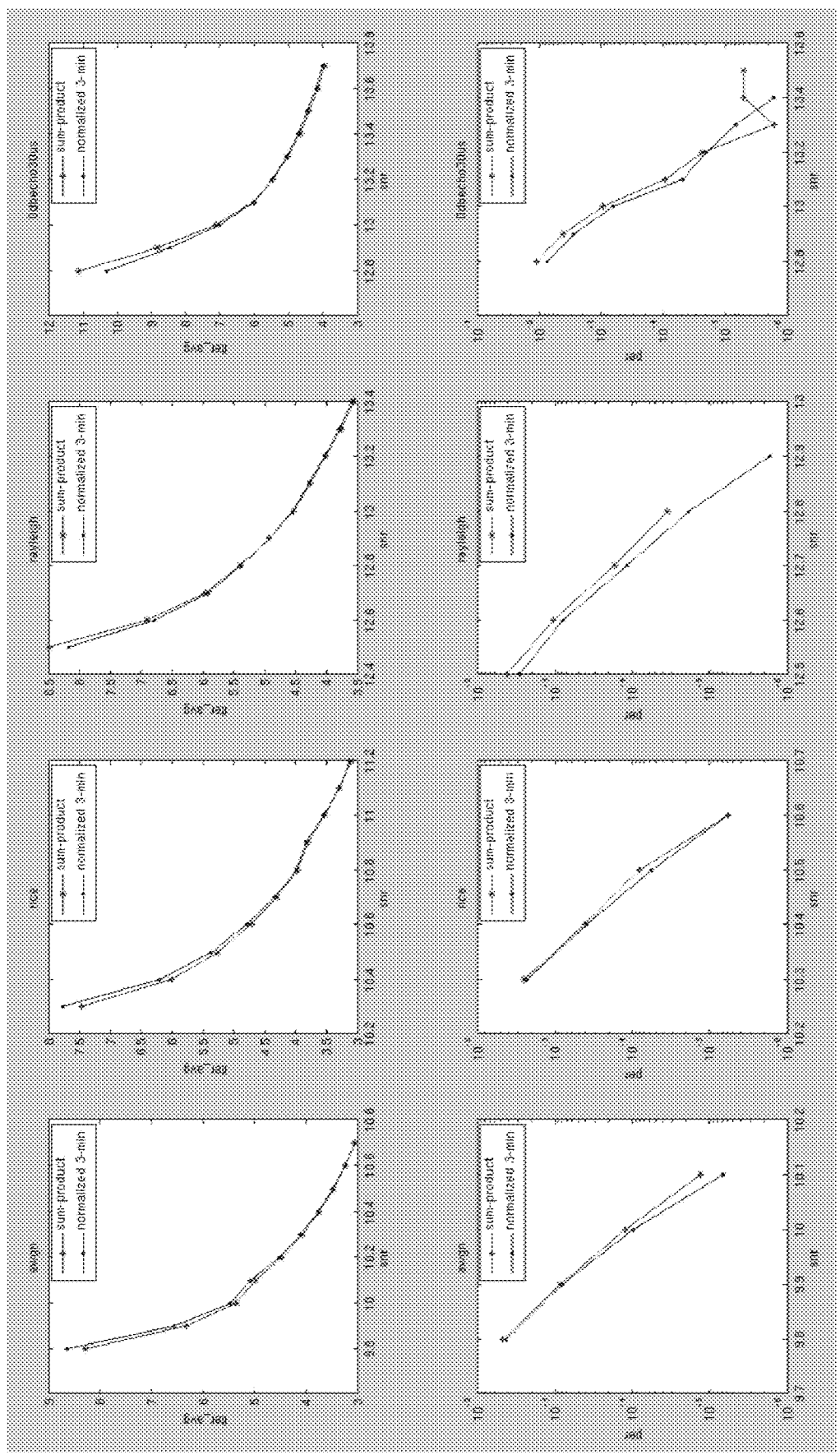
Figure 8D:
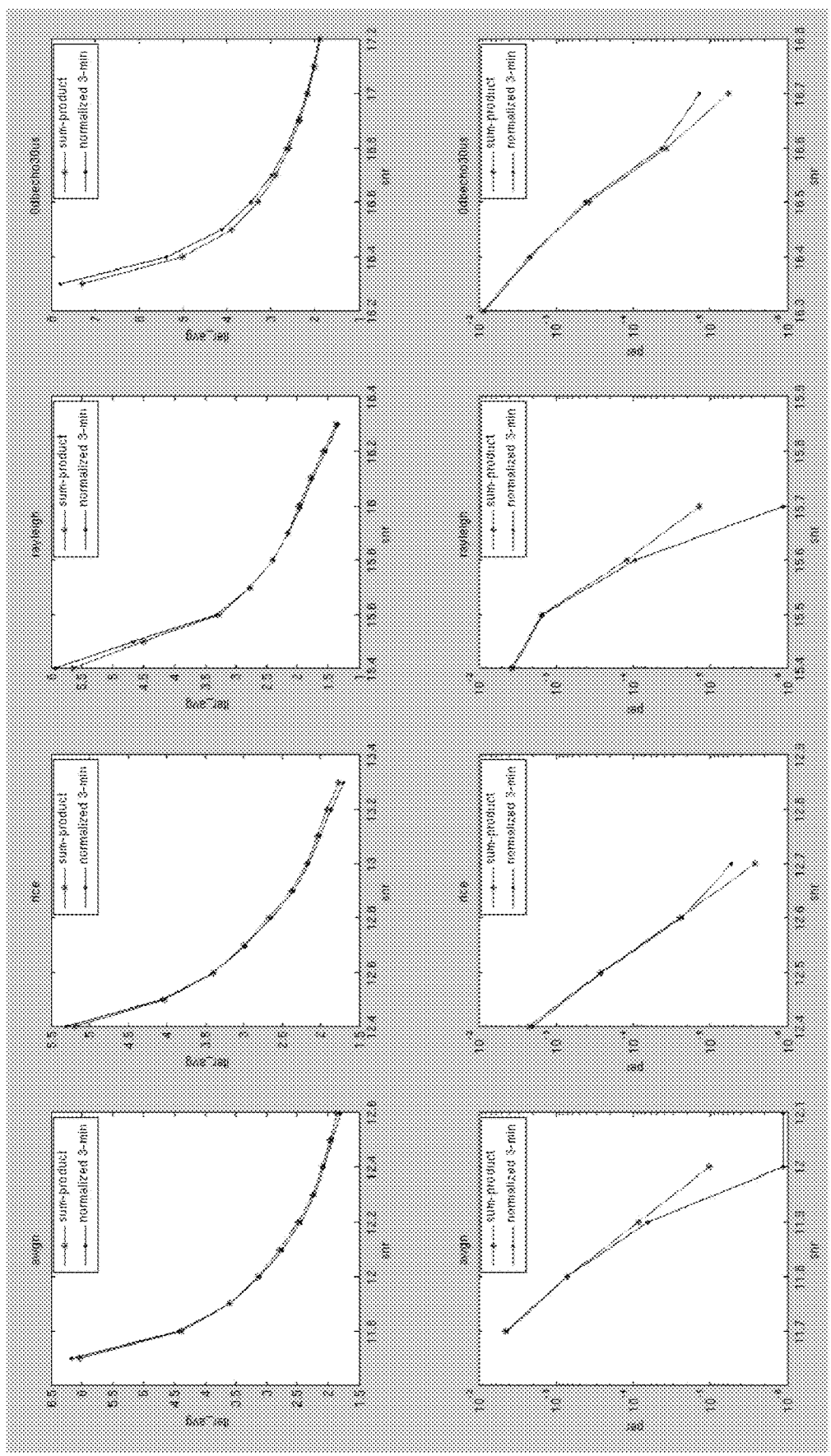
Figure 8E:
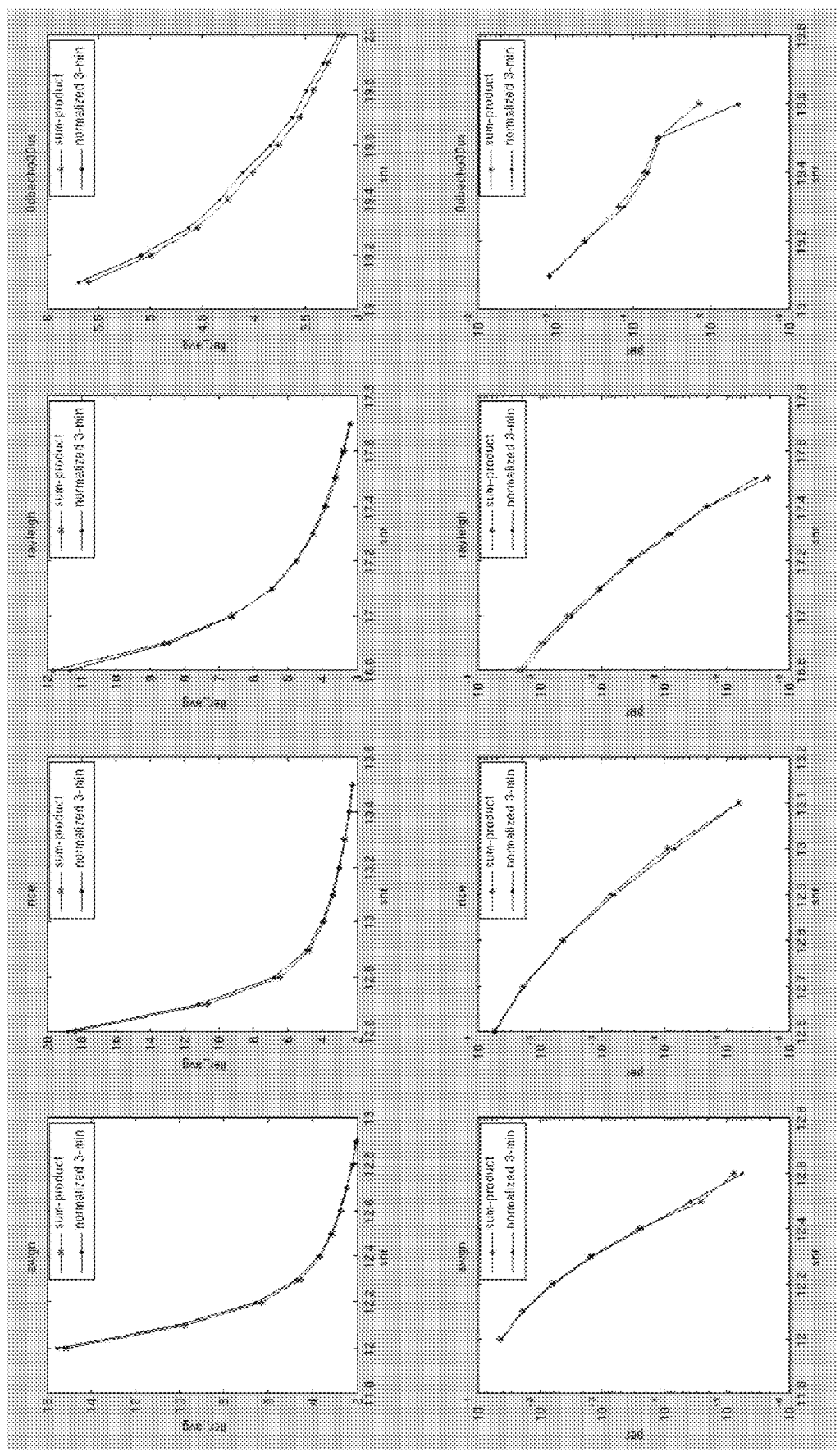
Figure 8F:
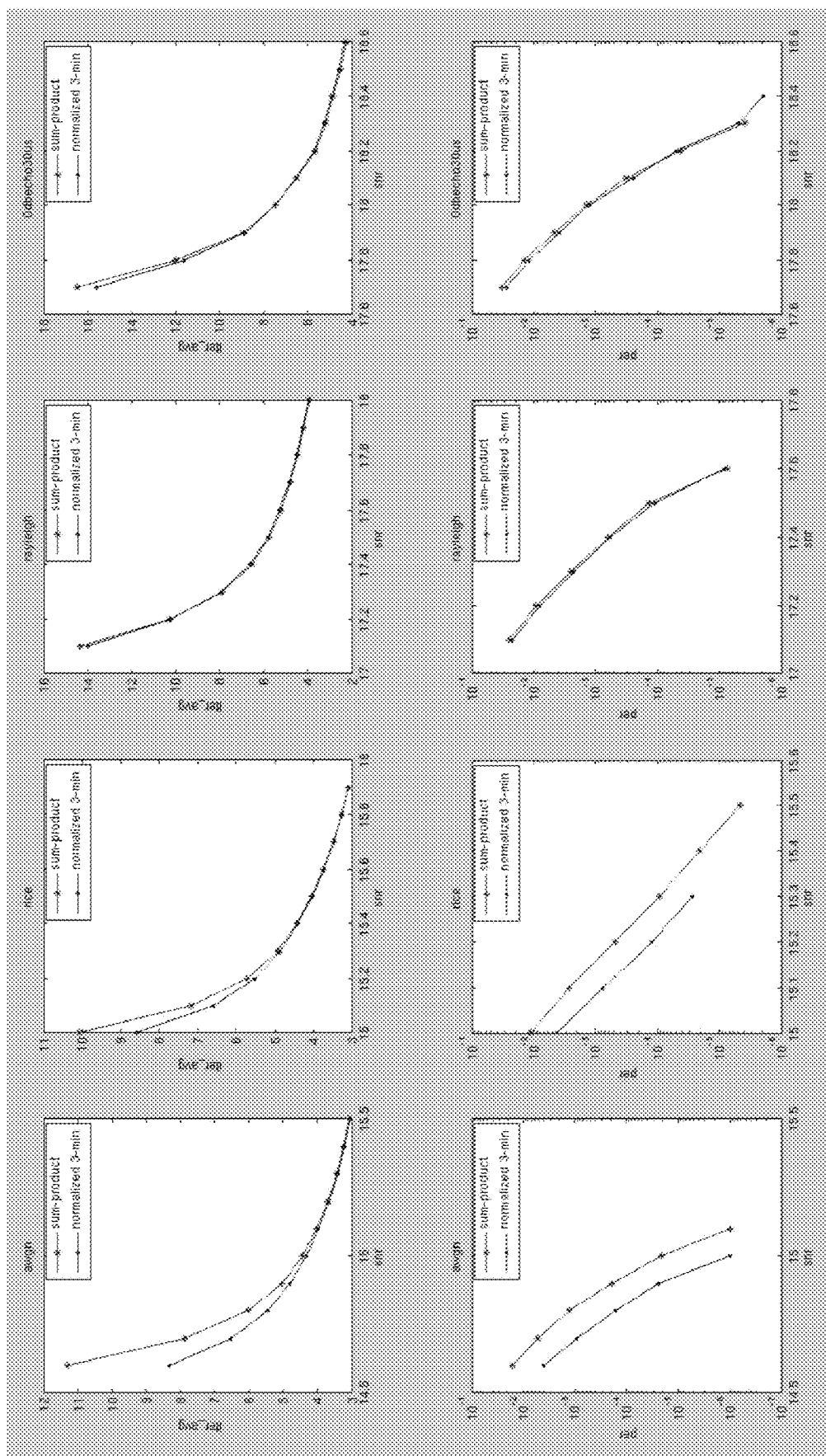
Figure 8G:
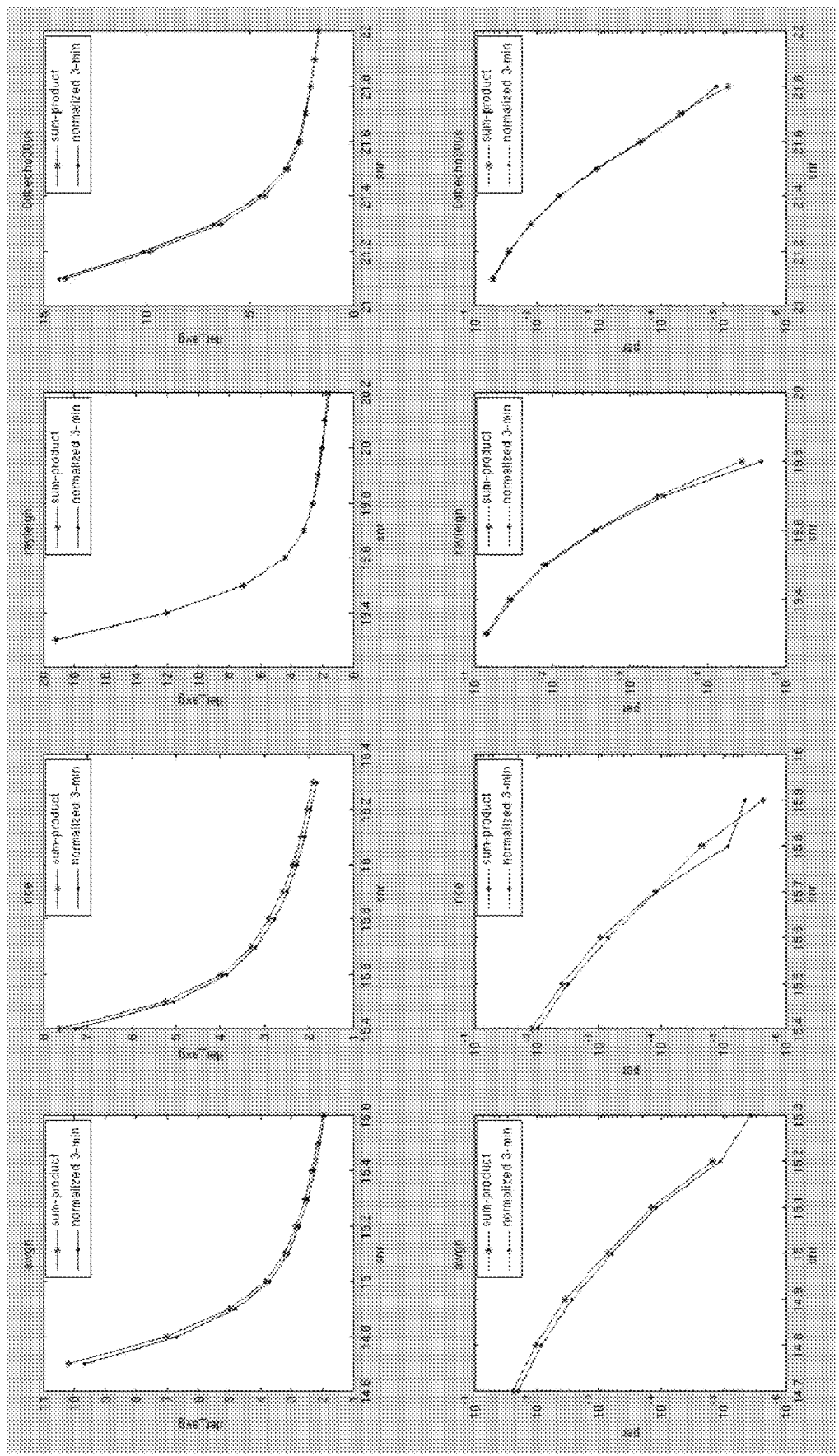
Figure 8H:
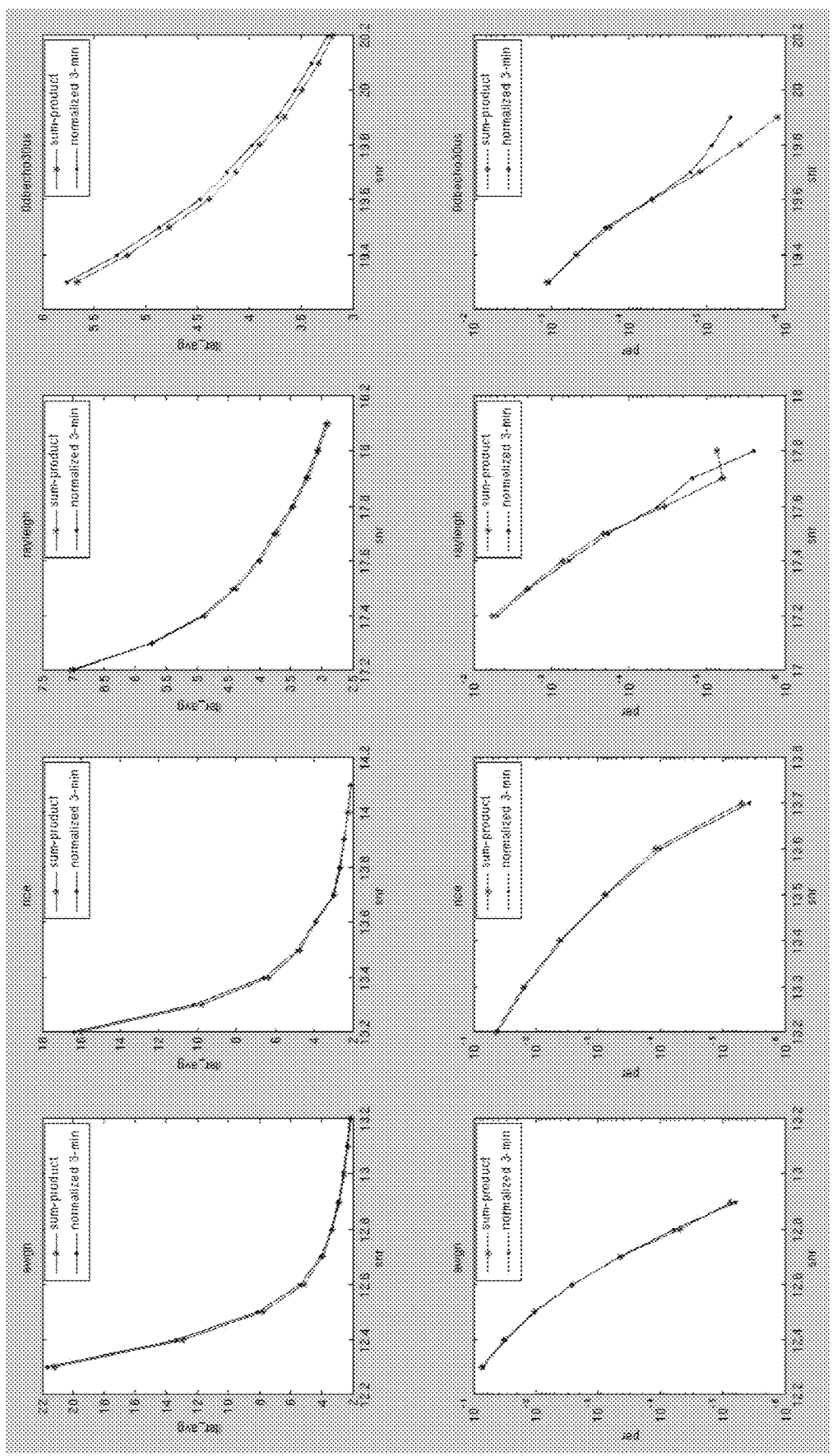
Figure 8I:
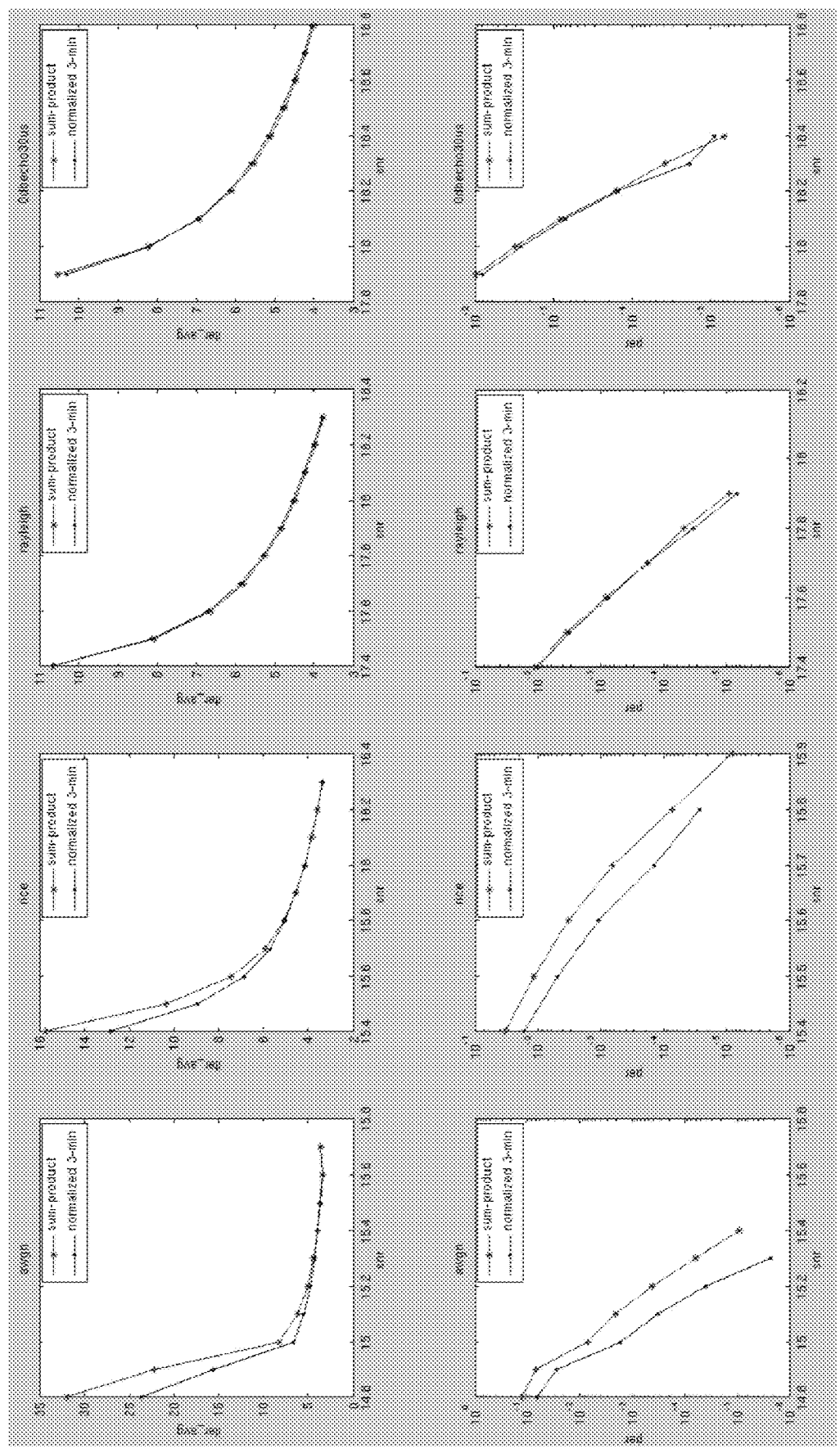
Figure 8J:
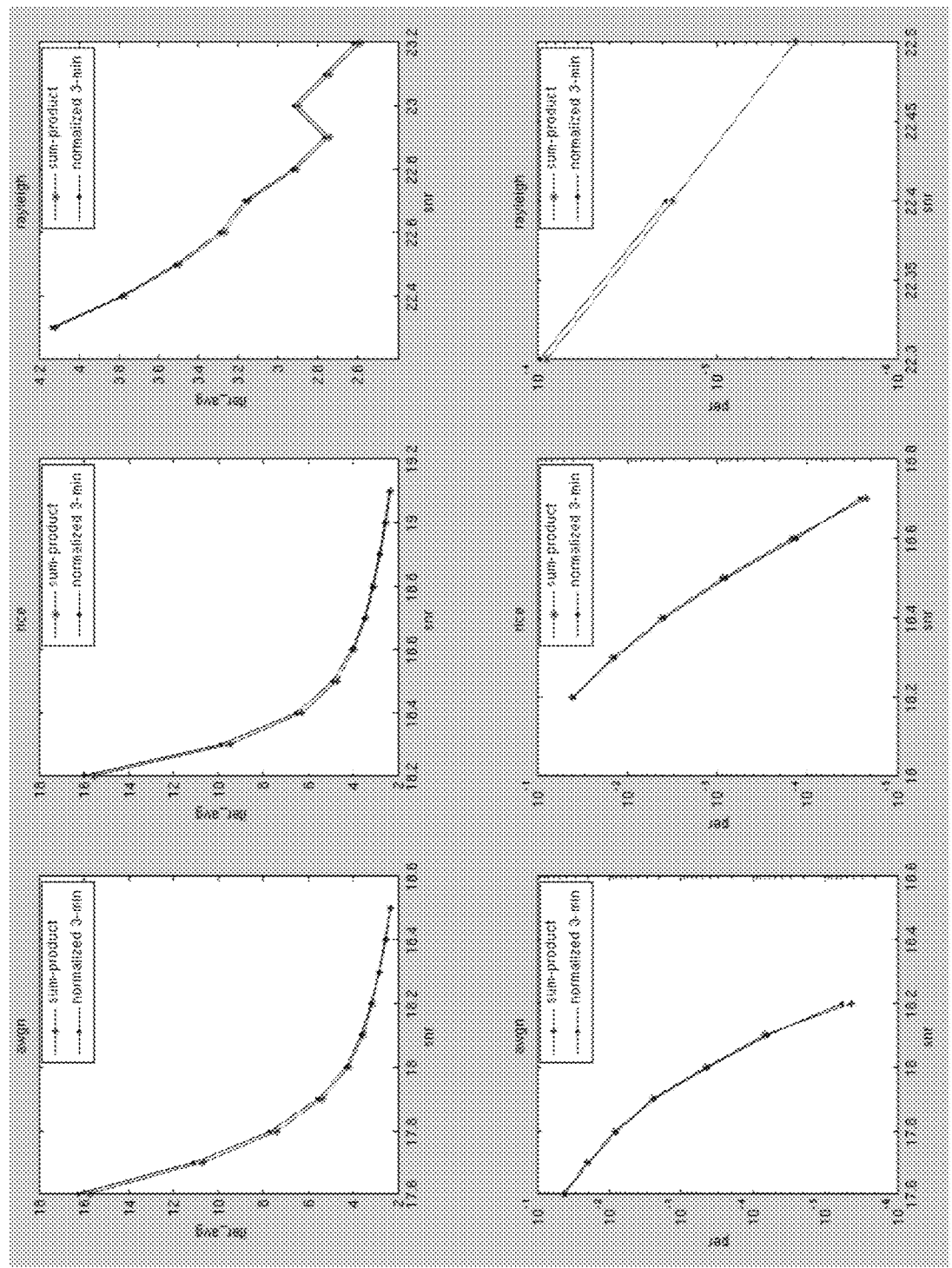

FIG. 7 shows the implementation flow of LDPC. The iterations of LDPC codes are divided into large iteration and small iteration: small iteration is based on each row of the check matrix, including two phases, rwsr and cwsr. A large iteration update is accomplished after all the small iterations are accomplished. That is, all the values of the check node and the variable node are calculated for one time, when the maximum number of iterations is reached or the check equation is satisfied, the iteration of the entire decoder is terminated and the final result is given by the hard decision.

This embodiment illustrates the structure and simulation performance, the performance of awgn, rice, rayleigh and 0db-echo at 30 us is simulated by model-mode10 which are prescribed by the new DTMB test standard. Upon the simulation results, the performance of the simplified structure is superior to that of the simplified methods listed in other patents and literatures (such as normalized min-sum), and its hardware implementation resources can save the storage by about 41K rain with respect to the original algorithm. As shown in FIGS. 8a-8j, the performance of awgn, rice, rayleigh and 0db-echo at 30 us is simulated by model-mode10 which are prescribed by the new DTMB test standard under. As can be seen, the performance of the proposed simplified method is equivalent to that of the original algorithms.

Figure 9:
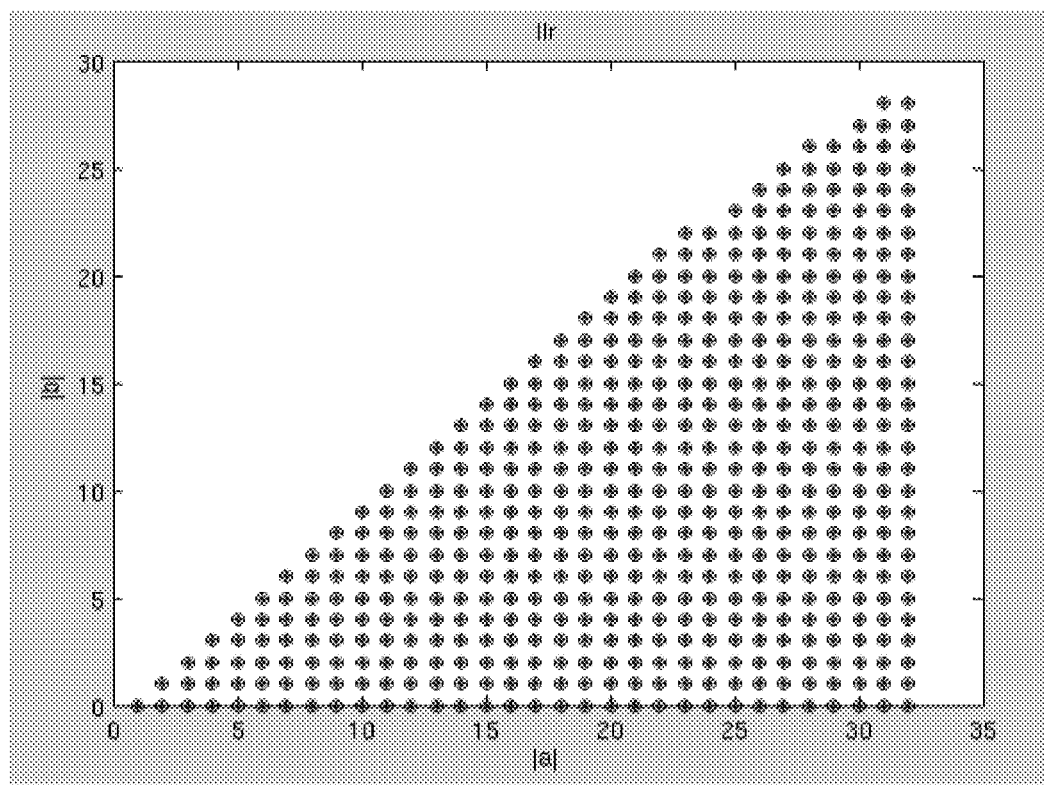
FIG. 9 is a diagram of simulation result of the LLR operation unit in the present invention.

FIG. 9 is a simulation result of the original method of the LLR operation unit, and a simulation result of the proposed method of the present embodiment (as previously described: saving the storage cell). It can be seen that the two simulations are exactly the same, and in which "*" represents the original log function, blue "o" represents the calculation method proposed in this invention.

In conclusion, the storage capacity of the invention is only about half of that of the sum-product algorithm, and when the same BER performance is achieved, the number of iterations can be about half of the sum-product algorithm, so as to achieve a tradeoff in area and processing speed. According to the structural characteristics of the DTMB LDPC code, a simplified decoding method and a calculation method of the LLR operation are proposed in consideration of both performance and hardware implementation, its performance is equivalent to the original algorithm, and the storage capacity in which the algorithm consumes is less than that of the original algorithm.

The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. An LDPC decoding method, a LDPC decoder has five blocks of logic operation unit: recovery circuit, search module, adding circuit, permute network, and check equation calculation unit, iterations of LDPC codes are divided into first and second iterations, the first iteration reviews each row of a check matrix, the first iteration includes a rwsr (Row-Wise Scanning Round) phase and a cwsr (Column-Wise Scanning Round) phase, wherein one of the second iterations is accomplished after all of the first iterations are completed, wherein all values of a check node and a variable node are calculated during one of the second iterations, and when a number of iterations equals a predetermined maximum value or a check equation is satisfied, the iteration is terminated and a final result is provided, the method comprising:

in an rwsr phase, a recovery circuit reads a plurality of sign bits, an absolute value of a minimum value, an absolute value of a second smallest value and an absolute value of a third smallest value, all of which are stored previously, the plurality of sign bits, the absolute value of the minimum value, the absolute value of the second smallest value and the absolute value of the third smallest value are output by a comparison and selector, the output of the comparison and selector is shifted, and then the output is combined with each of the plurality of sign bits to obtain an update message of a check node, wherein the update message is subtracted from a posterior probability by an adding circuit to obtain an input of an update unit;

in an cwsr phase, from each update message of the check node output by the recovery circuit, search the absolute value of the minimum value, the absolute value of the second smallest value and the absolute value of the third smallest value and a corresponding position of each value in the check matrix through a search module, each sign bit is stored in a corresponding RAM (random access memory), and a value of the posterior probability is updated based on the search;

wherein the absolute value of the minimum value and its corresponding position are stored in each update of the check node, the absolute value of the second smallest value and its corresponding position are stored in each update of the check node, and the absolute value of the third smallest value and its corresponding position are stored in each update of the check node; each of the plurality of sign bits of the variable node corresponding to the check node is stored;

a decoding formula in the decoding method is:

$$Lr_{c>v}^{k} = \prod_{n \in N(c)\backslash v} \mathrm{sgn}(Lq_{n>c}^{k-1}) \times \Phi\left(\sum_{n \in N_3(c)\backslash v} \Phi(|Lq_{n>c}^{k-1}|)\right) \times \alpha;$$

wherein, $Lr_{c>v}^{k}$ is an external log likelihood ratio information which is transmitted from check node c to variable node v in the $k^{th}$ iteration; $Lq_{n>c}^{k-1}$ is an external log likelihood ratio information which is transmitted from variable node n to check node c in the $(k-1)^{th}$ iteration; N(c)\v is a variable node set that is connected to check node c except for variable node v; $N_3$(c)\v is three minimum values of the N(c)\v set; sgn( ) is an operation which is used to obtain the sign bit; a is a normalization factor which is used to reduce values of the three minimum values in calculation; and the function Φ(x) is implemented by LLR operation, the formula of the LLR is:

$$LLR(|a|, |b|) = \min(|a|, |b|) + \left(\log\left(1 + e^{-\frac{|a+b|}{c}}\right) - \log\left(1 + e^{-\frac{|a-b|}{c}}\right)\right) \times c$$

wherein, c is the quantization factor; the absolute values of a and b are values in a predefined range, the predefined range is 0 to 31;

in the rwsr phase, a rearranged network takes out the value of the posterior probability, and maps the value to the input of the update unit according to an offset address in each row of the check matrix, to implement permute;

in the cwsr phase, the rearranged network updates output of the check node update unit back to the posterior probability according to the offset address in each row of the check matrix, to implement an anti-permute.

2. The LDPC decoding method according to claim 1, further comprising:

in a cwsr phase, a check equation calculation unit verifies whether a currently decoded codeword is valid or not.

3. The LDPC decoding method according to claim 1, wherein the recovery circuit, the search module and the adding circuit adopt a multi-way parallel operation mode.

* * * * *